(12) United States Patent
Kwon et al.

(10) Patent No.: US 7,969,796 B2
(45) Date of Patent: Jun. 28, 2011

(54) HIGH VOLTAGE GENERATING CIRCUIT AND SEMICONDUCTOR MEMORY DEVICE HAVING THE SAME AND METHOD THEREOF

(75) Inventors: Sang-hyuk Kwon, Seoul (KR); Hi-choon Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 409 days.

(21) Appl. No.: 12/007,721

(22) Filed: Jan. 15, 2008

(65) Prior Publication Data
US 2008/0170446 A1    Jul. 17, 2008

(30) Foreign Application Priority Data
Jan. 15, 2007 (KR) .................. 10-2007-0004319

(51) Int. Cl.
G11C 5/14 (2006.01)
(52) U.S. Cl. .......... 365/189.09; 365/222; 365/226; 365/227; 365/230.08; 365/233
(58) Field of Classification Search .......... 365/226, 365/230.03, 189.09, 236; 327/534, 535, 327/537, 538
See application file for complete search history.

(56) References Cited

U.S. PATENT DOCUMENTS

| 5,715,199 | A | * | 2/1998 | Kim | 365/189.09 |
| 5,889,719 | A | * | 3/1999 | Yoo et al. | 365/226 |
| 5,995,435 | A | * | 11/1999 | Hamamoto et al. | 365/226 |
| 7,307,897 | B2 | * | 12/2007 | Shin | 365/189.09 |
| 7,580,307 | B2 | * | 8/2009 | Ishikawa | 365/222 |

FOREIGN PATENT DOCUMENTS

| JP | 2003-219633 | 7/2003 |
| KR | 10-2000-0008363 | 2/2000 |
| KR | 1020000032290 | 6/2000 |
| KR | 10-2002-0002692 | 1/2002 |
| KR | 1020020002692 | 1/2002 |

OTHER PUBLICATIONS

Office Action dated Jan. 16, 2008 for corresponding Korean Application No. 2007-0004319.

* cited by examiner

*Primary Examiner* — Pho M Luu
*Assistant Examiner* — Tha-O Bui
(74) *Attorney, Agent, or Firm* — Harness, Dickey & Pierce, P.L.C.

(57) ABSTRACT

A high voltage generating circuit may include a pulse signal generator, a counter, a plurality of transmitters, and/or a plurality of pumpers. The pulse signal generator may be configured to be enabled in response to a refresh command signal to output a pulse signal. The counter may be configured to count the pulse signal and sequentially output a plurality of selection signals. The plurality of transmitters may be configured to be sequentially enabled in response to individual selection signals of the plurality of selection signals to transmit the pulse signal. The plurality of pumpers may correspond to the plurality of transmitters. Each of the plurality of pumpers may be configured to collectively generate a high voltage based on the transmitted pulse signal from a corresponding transmitter of the plurality of transmitters.

18 Claims, 7 Drawing Sheets

<DURING NORMAL OPERATION>

<DURING CBR REFRESH OPERATION>

HIGH VOLTAGE GENERATING CIRCUIT AND SEMICONDUCTOR MEMORY DEVICE HAVING THE SAME AND METHOD THEREOF

PRIORITY STATEMENT

This application claims the benefit of priority to Korean Patent Application No. 10-2007-0004319 filed on Jan. 15, 2007 in the Korean Intellectual Property Office, the entire contents of which are incorporated herein by reference in their entirety by reference.

BACKGROUND

1. Field

Example embodiments relate to a high voltage generating circuit and/or a semiconductor memory device having the same and/or a method thereof.

2. Description of Related Art

In conventional semiconductor memory devices, e.g., Dynamic Random Access Memory (DRAM), an NMOS transistor is used as a switching element of a memory cell. Accordingly, a voltage that is applied to a gate terminal of the NMOS transistor of the selected memory cell needs to be higher than a voltage level of data stored or to be stored in the memory cell by the threshold voltage of the NMOS transistor. Therefore, the DRAM includes a high voltage generating circuit that generates a high voltage Vpp larger than a power supply voltage supplied from the outside.

High voltage generating circuits may be included to correspond to individual memory banks. During a normal operation of the DRAM, only the high voltage generating circuits corresponding to the selected memory banks are enabled to output the high voltage Vpp, and the high voltage generating circuits corresponding to the unselected memory banks are disabled to not output the high voltage Vpp. During an automatic refresh (or a column address strobe (CAS) before row address strobe (RAS) refresh (hereinafter, referred to as a "CBR refresh")) operation, all the high voltage generating circuits are enabled together to output the high voltage Vpp.

Accordingly, a fluctuation in the high voltage Vpp is increased, and excessive stress is applied to the memory cells.

SUMMARY

Example embodiments may provide a high voltage generating circuit configured to reduce a fluctuation in a high voltage.

Example embodiments may provide a semiconductor memory device having a high voltage generating circuit configured to reduce a fluctuation in a high voltage.

Example embodiments may provide a method of generating a high voltage which may reduce a fluctuation in the high voltage.

According to an example embodiment, a high voltage generating circuit may include a pulse signal generator, a counter, a plurality of transmitters, and/or a plurality of pumpers. The pulse signal generator may be configured to be enabled in response to a refresh command signal to output a pulse signal. The counter may be configured to count the pulse signal and sequentially output a plurality of selection signals. The plurality of transmitters may be configured to be sequentially enabled in response to individual selection signals of the plurality of selection signals to transmit the pulse signal. The plurality of pumpers may correspond to the plurality of transmitters. Each of the plurality of pumpers may be configured to collectively generate a high voltage based on the transmitted pulse signal from a corresponding transmitter of the plurality of transmitters.

According to an example embodiment, semiconductor memory device may include first to n-th memory banks, first to n-th pulse generators, and the high voltage generator. The first to n-th memory banks may be configured to be selected in response to individual bank selection signals of a plurality of bank selection signals. The first to n-th pulse generators may correspond to the first to n-th memory banks, and/or the first to n-th pulse generators may be configured to be enabled in response to a corresponding individual bank selection signal during a normal operation to output a normal pulse signal, and/or configured to be disabled during a refresh operation. The plurality of pumpers may be first to n-th pumpers corresponding to the first to n-th memory banks. Each of the first to n-th pumpers may be configured to collectively generate the high voltage based on the normal pulse signal supplied from a corresponding enabled pulse generator during the normal operation and/or collectively generate the high voltage based on the transmitted pulse signal from the corresponding transmitter of the plurality of transmitters during the refresh operation According to an example embodiment, a semiconductor memory device may include a plurality of memory banks, a plurality of high voltage suppliers, and/or a high voltage generation control circuit. The plurality of memory banks may be configured to be separately accessible. The plurality of high voltage suppliers may correspond to the memory banks and/or may be configured to generate a high voltage. The high voltage generation control circuit may be configured to enable the high voltage suppliers corresponding to accessed memory banks of the plurality of memory banks during a normal operation and/or sequentially enable the high voltage suppliers during a refresh operation.

According to an example embodiment, a method of generating a high voltage may include generating a pulse signal in response to a refresh command signal. The pulse signal may be counted and/or a plurality of selection signals may be sequentially generated. The pulse signal may be sequentially transmitted as a plurality of sequentially transmitted pulse signals in response to individual selection signals of the plurality of selection signals. The high voltage may be generated based on the sequentially transmitted pulse signals.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
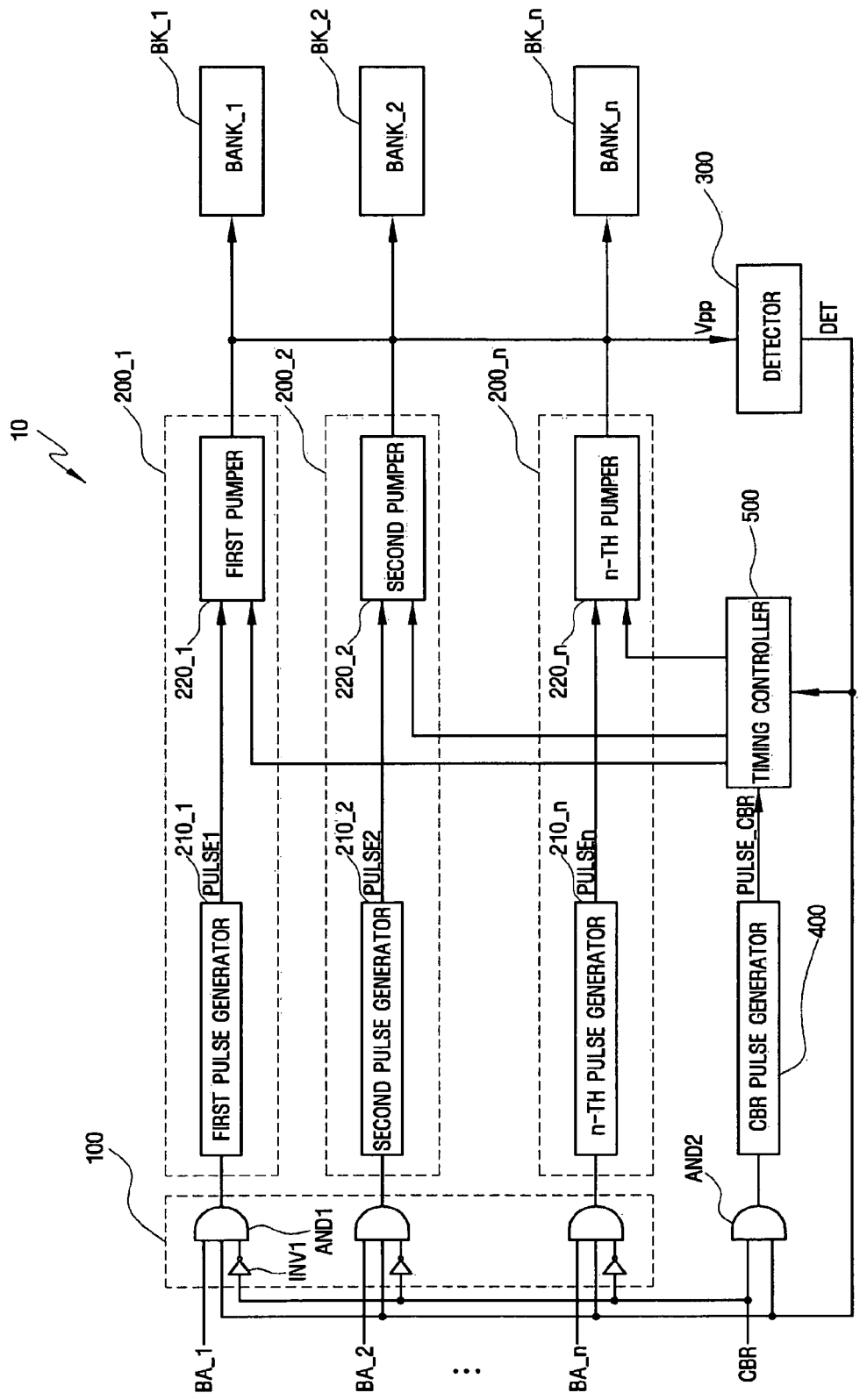
FIG. 1 is a block diagram illustrating a high voltage generating circuit and a semiconductor memory device having the same according to an example embodiment.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 2:
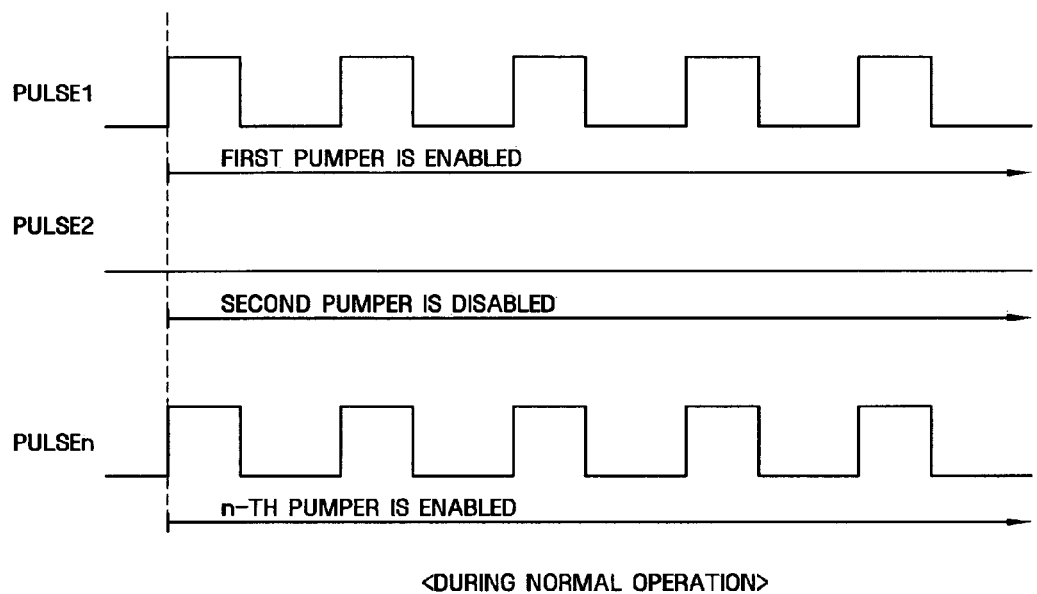
FIG. 2 is an example signal waveform chart illustrating an operation of the high voltage generating circuit and the semiconductor memory device having the same of FIG. 1.
Figure 2:
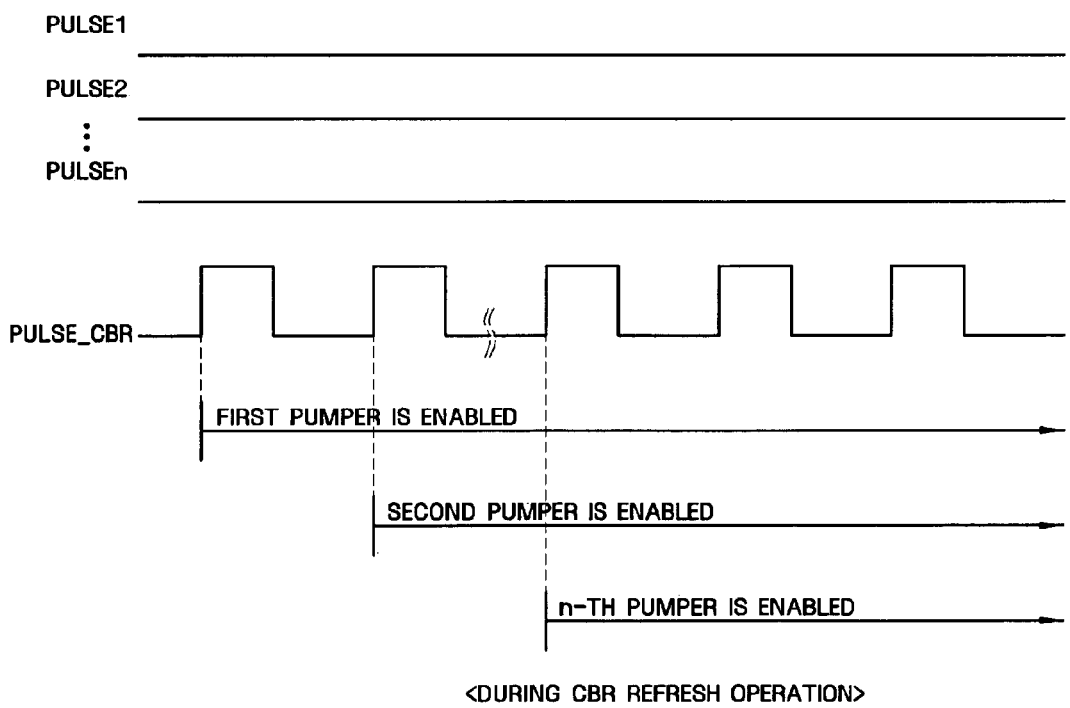
Figure 3:
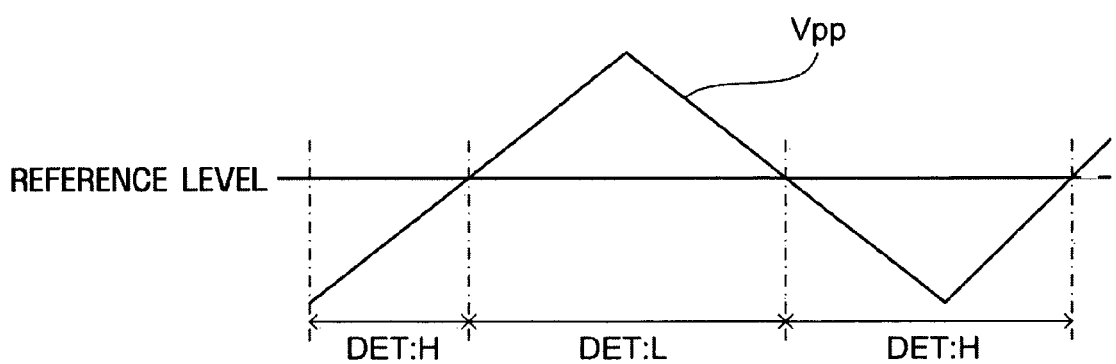
FIG. 3 is an example signal waveform chart illustrating an operation of a detector shown in FIG. 1.
Figure 4:
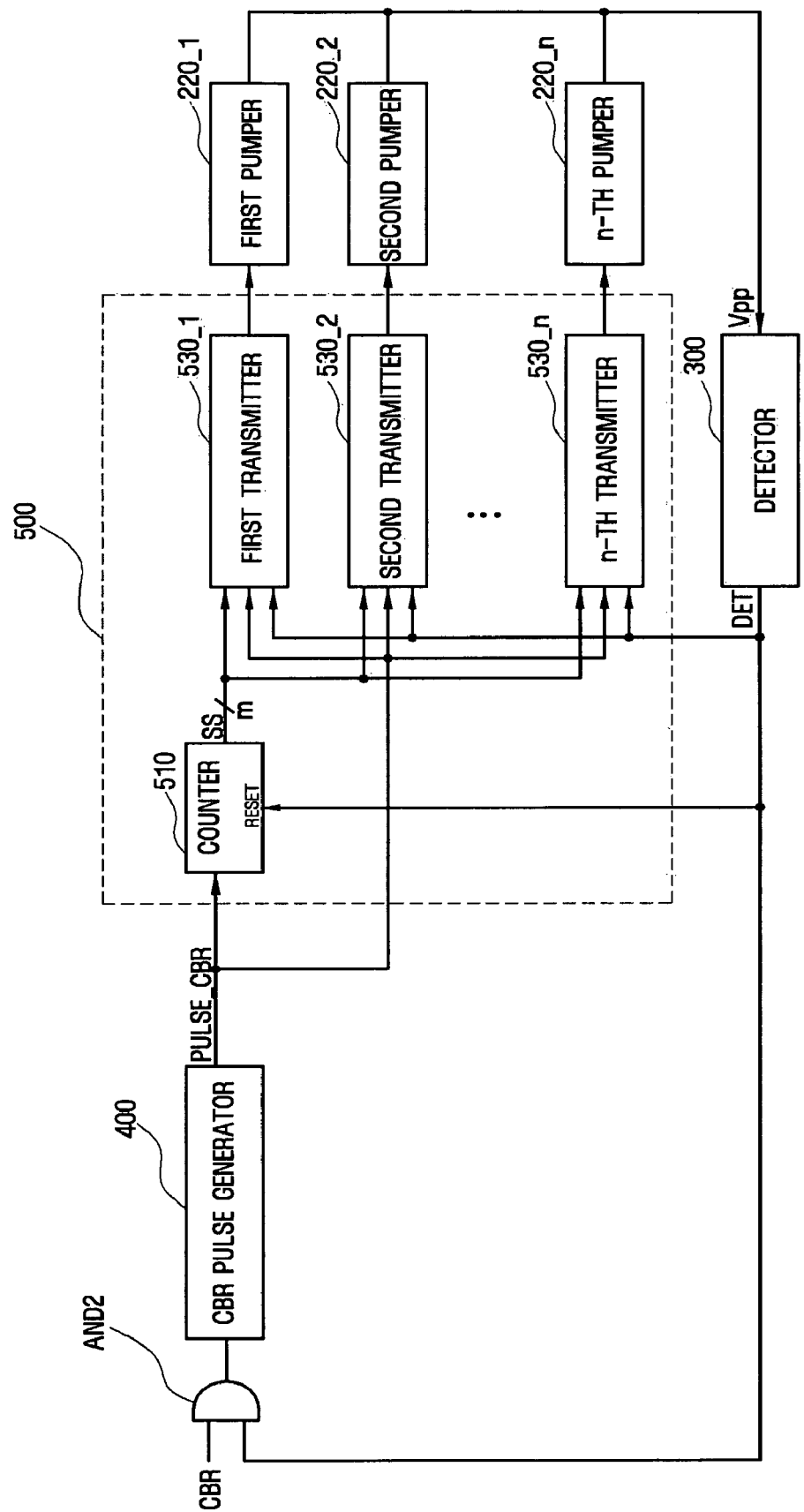
FIG. 4 is a block diagram illustrating a timing controller shown in FIG. 1.

A high voltage generating circuit and a semiconductor memory device having the same according to an example embodiment are described below with reference to FIGS. 1 to 4. FIG. 1 is a block diagram illustrating a high voltage generating circuit and a semiconductor memory device having the same according to an example embodiment. FIG. 2 is an example signal waveform chart illustrating an operation of the high voltage generating circuit and the semiconductor memory device having the same of FIG. 1. FIG. 3 is an example signal waveform chart illustrating an operation of a detector shown in FIG. 1. FIG. 4 is a block diagram illustrating a timing controller shown in FIG. 1.

Referring to FIG. 1, a semiconductor memory device 10 according to an example embodiment may include a plurality of memory banks BK_1 to BK_n configured to be separately accessible, high voltage suppliers 200_1 to 200__n provided to correspond to the memory banks BK_1 to BK_n and configured to generate a high voltage Vpp (e.g., a voltage higher than a threshold voltage of a transistor in selected memory cell), and/or a high voltage generation control circuit (e.g., 100, 300, 400, and/or 500) configured to enable a desired, or alternatively, a predetermined number of the high voltage suppliers 200_1 to 200__n corresponding to the accessed memory banks among the memory banks BK_1 to BK_n during a normal operation and/or sequentially enable the plurality of high voltage suppliers 200_1 to 200__n during a column address strobe (CAS) before row address strobe (RAS) refresh (hereinafter, referred to as a "CBR refresh")) operation. For example, during the normal operation, the enabled high voltage suppliers of the plurality of high voltage suppliers 200_1 to 200__n may generate the high voltage Vpp. During the CBR refresh operation, the high voltage suppliers 200_1 to 200__n may sequentially generate the high voltage Vpp. However, during the CBR refresh operation, the high voltage suppliers 200_1 to 200__n may be sequentially enabled to generate the high voltage Vpp until the high voltage Vpp reaches a reference level. If the high voltage Vpp reaches the reference level, each of the high voltage suppliers 200_1 to 200__n may be disabled, and the high voltage Vpp may not be generated. The enabled high voltage suppliers 200_1 to 200__n may continuously generate the high voltage Vpp until the high voltage Vpp reaches the reference level.

For example, the high voltage suppliers 200_1 to 200__n may correspondingly include pulse generators 210_1 to 210__n and/or pumpers 220_1 to 220__n. The high voltage generation control circuit may include a decoder 100, a CBR pulse generator 400, a timing controller 500, and/or a detector 300.

As shown in FIG. 3, the detector 300 may output a detection signal DET at a high level (H) if the voltage level of the high voltage Vpp is lower than the reference level, and/or output the detection signal DET at a low level (L) if the voltage level of the high voltage Vpp is higher than the reference level.

The decoder 100 may include inverters INV1 and AND gates AND1. For example, the decoder 100 may include an AND gate AND1 and an inverter INV1 corresponding to each high voltage supplier 200_1 to 200__n. Each AND gate AND1 may receive a corresponding bank selection signal of the bank selection signals BA_1 to BA_n, the detection signal DET, and/or a CBR command signal inverted by a corresponding inverter INV1. The decoder 100 may receive the bank selection signals BA_1 to BA_n during the normal operation, and/or enable the pulse generators 210_1 to 210_$n$ of the high voltage suppliers 200_1 to 200_$n$ corresponding to the memory banks BK_1 to BK_n to be selected according to the bank selection signals BA_1 to BA_n. The decoder 100 may disable all the pulse generators 210_1 to 210_$n$ during the CBR refresh operation.

The CBR pulse generator 400 may be disabled during the normal operation, but may be enabled during the CBR refresh operation to supply a CBR pulse signal PULSE_CBR. For example, an AND gate AND2 may receive the detection signal DET and the CBR command signal CBR and output a result to the CBR pulse generator 400.

The timing controller 500 may sequentially transmit the CBR pulse signal PULSE_CBR to the pumpers 220_1 to 220_$n$ during the CBR refresh operation.

Operations during the normal operation and the CBR refresh operation will be described in detail with reference to FIGS. 1 to 3.

During the normal operation, the CBR command signal CBR may become a low level.

If the bank selection signals BA_1 and BA_n for selecting the first memory bank BK_1 and the n-th memory bank BK_n are supplied, and the detection signal DET is at the high level, the first pulse generator 210_1 and the n-th pulse generator 210_$n$ may be enabled to supply the pulse signals PULSE1 and PULSEn, respectively. The second pulse generator 210_2 may be disabled, and the pulse signal PULSE2 may not be output.

The first pumper 220_1 and the n-th pumper 220_$n$ may receive the pulse signals PULSE1 and PULSEn, respectively, and/or generate the high voltage Vpp using the pulse signals PULSE1 and PULSEn. If the detector 300 supplies the detection signal DET at the low level, for example, if the high voltage Vpp is equal to or larger than the reference level (e.g., see FIG. 3), the decoder 100 may receive the detection signal DET at the low level and/or disable the first to n-th pulse generators 210_1 to 210_$n$. If the pulse generators 210_1 to 210_$n$ are disabled, the pulse signals PULSE1 to PULSEn may not be output, and the pumpers 220_1 to 220_$n$ may not output the high voltage Vpp.

During the CBR refresh operation, the CBR command signal CBR may become a high level.

The decoder 100 may receive the CBR command signal CBR at the high level and disables the first to n-th pulse generators 210_1 to 210_$n$. Accordingly, the first to n-th pulse generators 210_1 to 210_$n$ may not output the pulse signals PULSE1 to PULSEn, respectively. However, if the detection signal DET is at the high level, the CBR pulse generator 400 may be enabled in response to the CBR command signal CBR and/or output the CBR pulse signal PULSE_CBR.

The timing controller 500 may receive the CBR pulse signal PULSE_CBR and/or sequentially supply the received CBR pulse signal PULSE_CBR to the first to n-th pumpers 220_1 to 220_$n$. For example, as shown in FIG. 2, the timing controller 500 may supply the CBR pulse signal PULSE_CBR to the first pumper 220_1 at the first rising edge of the CBR pulse signal PULSE_CBR, supply the CBR pulse signal PULSE_CBR to the second pumper 220_2 at the second rising edge of the CBR pulse signal PULSE_CBR, and/or supply the CBR pulse signal PULSE_CBR to the n-th pumper 220_$n$ at the n-th rising edge of the CBR pulse signal PULSE_CBR. The individual pumpers 220_1 to 220_$n$ may be enabled at a timing at which the CBR pulse signal PULSE_CBR is supplied, and/or generate the high voltage Vpp using the CBR pulse signal PULSE_CBR.

For example, if the CBR pulse generator 400 begins to supply the CBR pulse signal PULSE_CBR, each of the pumpers 220_1 to 220_$n$ may not generate the high voltage Vpp. Because the number of the pumpers 220_1 to 220_$n$ that generate the high voltage Vpp may be gradually increased, a fluctuation in the high voltage Vpp may be reduced and/or not as noticeable. For example, after the CBR pulse generator 400 begins to supply the CBR pulse signal PULSE_CBR, the voltage level of the high voltage Vpp may be gradually increased. In the foregoing description, a case where the timing controller 500 controls the CBR pulse generator 400 to sequentially supply the CBR pulse signal PULSE_CBR to the pumpers 220_1 to 220_$n$ at each rising edge of the CBR pulse signal PULSE_CBR has been described, however example embodiments are not limited thereto. For example, the timing controller 500 may control the CBR pulse generator 400 to sequentially supply the CBR pulse signal PULSE_CBR to the pumpers 220_1 to 220_$n$ at every second, third, or more rising edges. Accordingly, the high voltage may be more gradually increased. For example, an increase rate of the high voltage Vpp may be adjusted.

If the pumpers 220_1 to 220_$n$ begin to sequentially generate the high voltage Vpp, the voltage level of the high voltage Vpp may be increased. If the high voltage Vpp becomes higher than the reference level, for example, if the detection signal DET becomes the low level, the CBR pulse generator 400 may be disabled and/or may not output the CBR pulse signal PULSE_CBR. The timing controller 500 may also receive the detection signal DET, and/or the timing controller 500 may not transmit the CBR pulse signal PULSE_CBR to the pumpers 220_1 to 220_$n$ if the detection signal DET is at the low level.

Accordingly, during the CBR refresh operation, each of the pumpers 220_1 to 220_$n$ may not generate the high voltage Vpp. The number of the pumpers 220_1 to 220_$n$ that generate the high voltage Vpp may be increased, and/or a fluctuation in the high voltage Vpp may be reduced and/or less noticeable.

The timing controller 500 shown in FIG. 1 will be described in detail with reference to FIG. 4. Referring to FIG. 4, the timing controller 500 may include a counter 510 and/or first to n-th transmitters 530_1 to 530_$n$.

The counter 510 may count the CBR pulse signal PULSE_CBR and/or sequentially output a plurality of m-bit selection signals SS. For example, a selection signal SS may be an m-bit signal that selects at least one of the first to n-th transmitters 530_1 to 530_$n$. As described above, the counter 510 may be a counter (e.g., an up-counter) that counts (e.g., up-counts) rising edges of the CBR pulse signal PULSE_CBR. However, example embodiments are not limited thereto, and various types of known counters may be used. The counter 510 may receive the detection signal DET. The detection signal DET may be input to a reset terminal RESET, and if the detection signal DET is at the low level the counter 510 may be reset. For example, the counter 510 may be reset by the detection signal DET at the low level. If the detection signal DET is at the high level, the counter 510 may begin to count rising edges of the CBR pulse signal, e.g., from a count of zero.

The first to n-th transmitter s 530_1 to 530_$n$ may be sequentially enabled in response to the selection signals SS supplied from the counter 510 and/or transmit the CBR pulse signal PULSE_CBR to the pumpers 220_1 to 220_$n$. The enabled transmitters 530_1 to 530_$n$ may transmit the CBR pulse signal PULSE_CBR to the pumpers 220_1 to 220_*n* if the detection signal DET is at the low level. If the detection signal DET becomes the high level, the transmitters 530_1 to 530_*n* may not transmit the CBR pulse signal PULSE_CBR.

Figure 5:
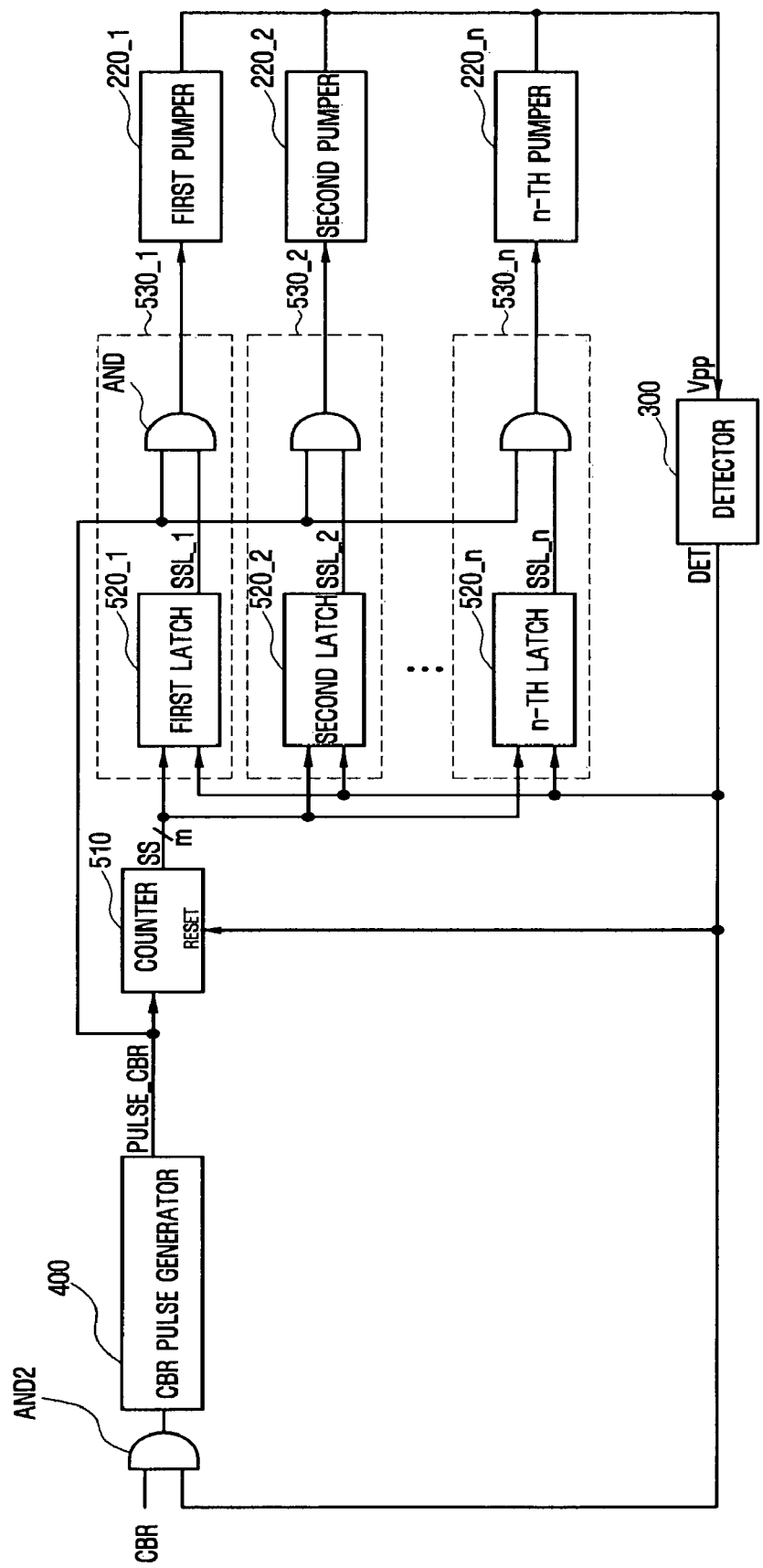
FIG. 5 is a block diagram illustrating a high voltage generating circuit and a semiconductor memory device having the same according to an example embodiment.
Figure 6:
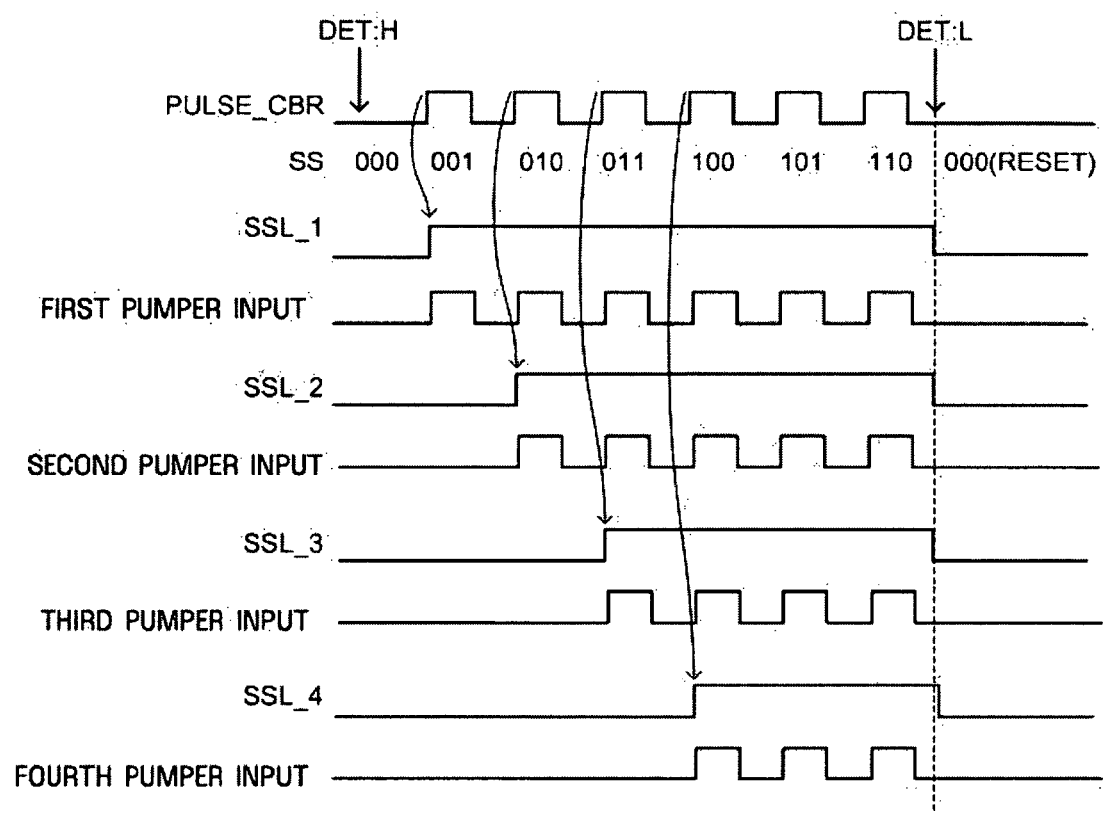
FIG. 6 is an example signal waveform chart illustrating operations of a high voltage generating circuit and a semiconductor memory device having the same according to an example embodiment.
Figure 7:
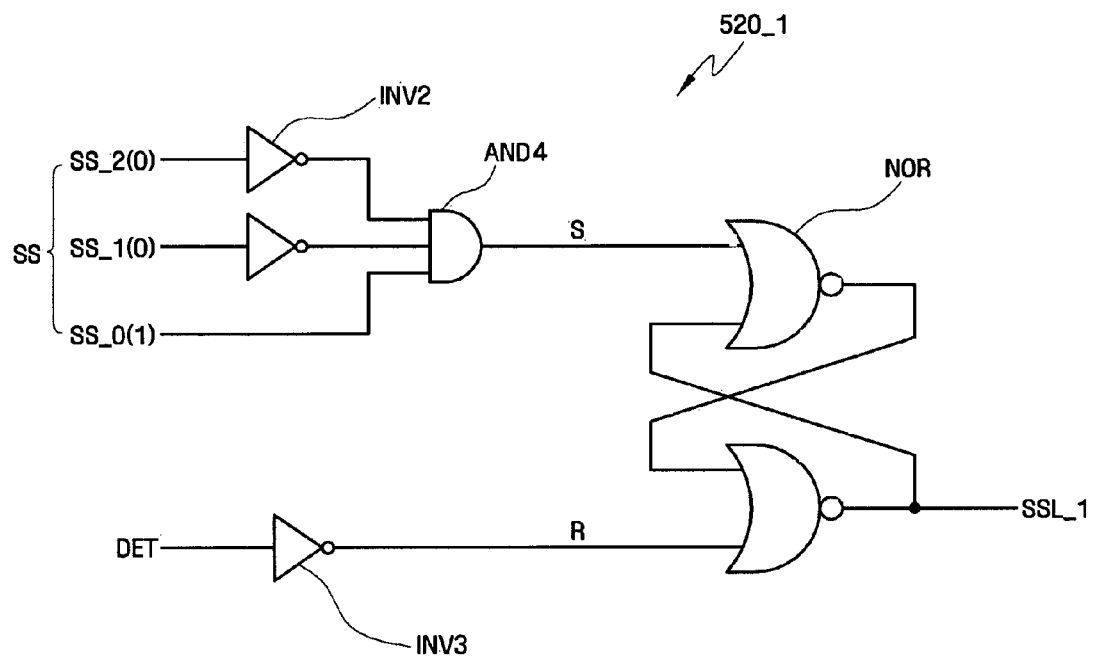
FIG. 7 is a circuit diagram illustrating each latch shown in FIG. 5.

A high voltage generating circuit and a semiconductor memory device having the same according to an example embodiment will be described below with reference to FIGS. 5 to 7. FIG. 5 is a block diagram illustrating a high voltage generating circuit and a semiconductor memory device having the same according to an example embodiment. FIG. 6 is an example signal waveform chart illustrating operations of the high voltage generating circuit and the semiconductor memory device having the same according to an example embodiment. FIG. 7 is a circuit diagram illustrating the latches shown in FIG. 5.

Referring to FIG. 5, the transmitters 530_1 to 530_*n* shown in FIG. 4 may correspondingly include latches 520_1 to 520_*n* and/or AND gates AND3.

The latches 520_1 to 520_*n* may correspondingly output latch signals SSL_1 to SSL_n in response to the selection signals SS. The latch signals SSL_1 to SSL_n may be at the high levels if the high voltage Vpp is lower than the reference level (e.g., see FIG. 3), for example, if the detection signal DET is kept at the high level. The AND gates AND3 may be enabled in response to the latch signals SSL_1 to SSL_n and/or transmit the CBR pulse signal PULSE_CBR to the pumpers 220_1 to 220_*n*.

The high voltage generating circuit will be described in detail below with reference to FIGS. 5 and 6. If the CBR command signal CBR becomes the high level and the detection signal DET is at the high level during the CBR refresh operation, the CBR pulse generator 400 may output the CBR pulse signal PULSE_CBR.

If the CBR pulse signal PULSE_CBR is input the counter 510 may count the CBR pulse signal PULSE_CBR. A case where the counter 510 is a three-bit counter (e.g., in FIG. 5, m=3), and as shown in FIG. 6, will be described, however, example embodiments are not limited thereto and the counter 510 may be any number bit counter. The counter 510 may count in synchronization with the rising edge of the CBR pulse signal PULSE_CBR The counter 510 may output the selection signal SS of 000, and, if the first rising edge of the CBR pulse signal PULSE_CBR is counted, output the selection signal SS of 001 and/or supply the selection signal SS of 001 to the latches 520_1 to 520_*n*. If the selection signal SS of 001 is supplied, among a plurality of latches 520_1 to 520_*n* (hereinafter, a case where the number of the latches is 4 will be described, for example, in FIG. 5, n=4), at least one latch may be enabled. For example, the first latch 520_1 may be enabled. However example embodiments are not limited thereto, and unlike an example embodiment in FIG. 6, two latches may be enabled. If the first latch 520_1 is enabled in response to the selection signal SS of 001, the first latch 520_1 may continuously output the first latch signal SSL_1 at the high level while the detection signal DET is kept at the high level even though the selection signal SS changes. If the first latch signal SSL_1 is at the high level, the corresponding AND gate AND3 may begin to transmit the CBR pulse signal PULSE_CBR. The first latch 520_1 may include an SR latch circuit. The internal circuits and operations of the latches 520_1 to 520_*n* will be described below with reference to FIG. 7.

The counter 510 may count the second rising edge of the CBR pulse signal PULSE_CBR and/or supply the selection signal SS of 010 to the latches 520_1 to 520_*n*. If the selection signal SS of 010 is supplied, among the four latches 520_1 to 520_*n*, the second latch 520_2 may be enabled. The second latch 520_2 may be enabled in response to the selection signal SS of 010, and/or output the second latch signal SSL_2 at the high level. If the second latch signal SSL_2 is at the high level, the corresponding AND gate AND3 may begin to transmit the CBR pulse signal PULSE_CBR.

Accordingly, if the counter 510 counts the CBR pulse signal PULSE_CBR and supplies the selection signals SS of 011 and 100, the third latch may be enabled in response to the selection signal SS of 011, and/or the fourth latch may be enabled in response to the selection signal SS of 100. The enabled third and fourth latches may supply the third latch signal SSL_3 and the fourth latch signal SSL_4 at the high levels, respectively, and the corresponding AND gates AND3 may supply the CBR pulse signal PULSE_CBR to the third pumper and the fourth pumper in response to the third latch signal SSL_3 and the fourth latch signal SSL_4.

For example, the transmitters 530_1 to 530_*n* may be sequentially enabled to transmit the CBR pulse signal PULSE_CBR to the plurality of pumpers 220_1 to 220_*n*. If the plurality of pumpers 220_1 to 220_*n* sequentially generate the high voltage Vpp using the CBR pulse signal PULSE_CBR, the level of the high voltage Vpp may be gradually increased. If the high voltage Vpp is gradually increased and becomes larger than the reference level, the detector 300 may output the detection signal DET at the low level.

If the detection signal DET at the low level is supplied, the AND gate AND2 may disable the CBR pulse generator 400. The counter 510 may be reset by the detection signal DET at the low level, and/or as shown in FIG. 6, output the selection signal SS of 000 again. The detection signal DET at the low level may be supplied to the latches 520_1 to 520_*n*. If the detection signal DET at the low level is supplied to the latches 520_1 to 520_*n*, the latches 520_1 to 520_*n* may correspondingly output the latch signals SSL_1 to SSL_n at the low level.

The internal circuits and operations of the latches 520_1 to 520_*n* shown in FIG. 5 will be described in detail below with reference to FIGS. 6 and 7. For convenience of explanation, a description will be given by way of the first latch 520_1.

Referring to FIG. 7, the first latch 520_1 may include an SR latch circuit. The selection signal SS may be decoded and/or input to an S terminal S of the SR latch circuit, and/or the detection signal DET may be inverted by an inverter INV3 and/or input to an R terminal R of the SR latch circuit. The first latch 520_1 may include an inverter INV2 and an AND gate AND4 configured such that the S terminal S becomes the high level only if the uppermost bit SS_2 of the selection signal SS is 0, the intermediate bit SS_1 thereof is 0, and the lowermost significant bit SS_0 is 1. The SR latch circuit may include NOR gates NOR. However, example embodiments are not limited thereto. For example, the SR latch circuit may have NAND gates.

Operations of the first latch 520_1 will be described in detail with reference to Table 1, and FIGS. 6 and 7.

TABLE 1

| DET | SS | S | R | SSL_1 |
|---|---|---|---|---|
| L | 000 | L | H | L |
| H | 001 | H | L | H |
|  | 010 | L | L | Holding(H) |
|  | 011, 100, ... | L | L | Holding(H) |

Table 1 shows operations of the first latch 520_1 according to the detection signal DET and the selection signal SS. Referring to Table 1, and FIGS. 6 and 7, if the detection signal DET is at the low level (L) and the selection signal SS is 000, the R terminal R may become the high level (H), and/or the S terminal S may become the low level (L). Accordingly, the first latch signal SSL_1 may become the low level (L).

If the detection signal DET becomes the high level (H), the CBR pulse signal PULSE_CBR may be supplied, and/or the selection signal SS may become 001. The selection signal SS of 001 may be decoded by the inverter INV2 and/or the AND gate AND4 and/or change the level of the S terminal S to the high level (H). The R terminal R may become the low level (L) because the detection signal DET is at the high level (H). Accordingly, the first latch signal SSL_1 may become the high level (H).

If the selection signal SS becomes 010, the S terminal S may become the low level (L). However, because the R terminal R may be at the low level (L), the first latch signal SSL_1 may be kept at the high level (H). Even though the selection signal SS may change to 011 and 100, if the detection signal DET is at the high level (H), the R terminal (R) may be at the low level (L), and/or the first latch signal SSL_1 may be kept at the high level (H). Accordingly, as shown in FIG. 6, even though the selection signal SS changes, the CBR pulse signal PULSE_CBR may be continuously input to the first pumper 220_1.

If the detection signal DET becomes the low level (L), the selection signal SS may become 000. The S terminal S may become the low level (L), and/or the R terminal (R) may become the high level (H). Accordingly, the first latch signal SSL_1 may become the low level (L).

Latches 520_2 to 520_n may be similar in operation to the first latch 520_1 described above, and a description thereof is thus omitted. However, the selection signal SS may be decoded differently by each latch, for example, the latches may decode the selection signal SS such that an S terminal of each latch becomes the high level in response to a different value of the selection signal.

Accordingly, the transmitters 530_1 to 530_n may be correspondingly enabled in response to the selection signals SS, and/or the enabled transmitters 530_1 to 530_n may supply the CBR pulse signal PULSE_CBR to the pumpers 220_1 to 220_n until the detection signal DET becomes the low level.

Figure 8:
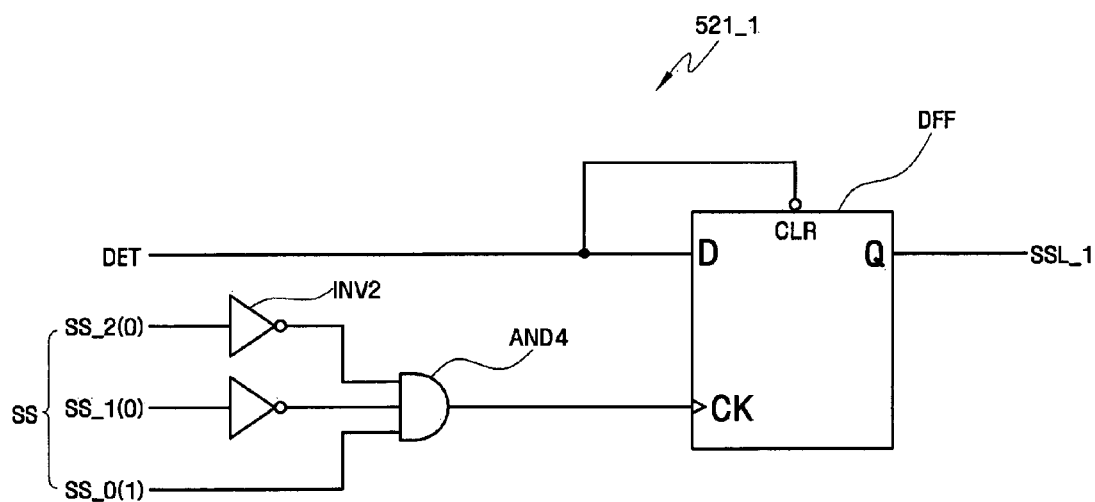
FIG. 8 is a circuit diagram illustrating a latch in a high voltage generating circuit and a semiconductor memory device having the same according to another example embodiment.

A high voltage generating circuit and a semiconductor memory device having the same according to another example embodiment will be described below with reference to FIGS. 6 and 8. FIG. 8 is a circuit diagram illustrating a latch in a high voltage generating circuit and a semiconductor memory device having the same according to another example embodiment. For convenience of explanation, a description will be given by way of the first latch.

Referring to FIG. 8, the first latch 521_1 may include a D flip-flop DFF. The detection signal DET may be input to an input terminal D of the D flip-flop DFF, the selection signal SS may be decoded and/or input to a clock terminal CK of the D flip-flop DFF, and/or the detection signal DET may be input to a clear terminal CLR of the D flip-flop DFF. The first latch 521_1 may include an inverter INV2 and/or an AND gate AND4 configured such that the clock terminal CK may become the high level only if the uppermost bit SS_2 of the selection signal SS is 0, the intermediate bit SS_1 of the selection signal SS is 0, and/or the lowermost bit SS_0 of the selection signal SS is 1. If the low level signal is input to the clear terminal CLR, the D flip-flop DFF may output 0 (zero) through an output terminal Q. If the high level signal is input to the clear terminal CLR, the D flip-flop DFF may output the state of the input terminal D (e.g., high level or low level) to the output terminal Q according to the input of the clock terminal CK.

The operations of the first latch 521_1 will be described in detail with reference to Table 2, and FIGS. 6 and 8.

TABLE 2

| DET(D/CLR) | SS | CK | SSL_1 |
|---|---|---|---|
| L | 000 | L | L |
| H | 001 | H | H |
|  | 010 | L | Holding(H) |
|  | 011, 100, . . . | L | Holding(H) |

Table 2 shows operations of the first latch 521_1 according to the detection signal DET and the selection signal SS. Referring to Table 2, and FIGS. 6 and 8, if the detection signal DET is at the low level (L) and the selection signal SS is 000, the low level (L) may be input to the input terminal D and the clear terminal CLR, and/or the low level (L) may be input to the clock terminal CK. If the low level (L) is input to the clear terminal CLR, the output terminal Q may become 0 (zero), and/or the first latch signal SSL_1 may be kept at the low level (L).

If the detection signal DET becomes the high level (H), the high level (H) may be input to the input terminal D and the clear terminal CLR of the D flip-flop DFF, and/or the selection signal SS may become 001. The selection signal SS of 001 may be decoded by the inverter INV2 and the AND gate AND4 and/or change the level of the clock terminal CK to the high level (H). Accordingly, the D flip-flop DFF may output the high level (H) of the input terminal D to the first latch signal SSL_1. Therefore, the first latch signal SSL_1 may become the high level (H).

If the selection signal SS becomes 010, the input terminal D of the D flip-flop DFF may become the low level (L). However, because the clock terminal CK is at the low level (L), the first latch signal SSL_1 may be kept at the high level (H). Even though the selection signal SS may be changed to 011 and 100, the clock terminal CK may not be changed to the high level, and/or the first latch signal SSL_1 may be kept at the high level (H). Accordingly, as shown in FIG. 6, even though the selection signal SS may change, the CBR pulse signal PULSE_CBR may be continuously input to the first pumper 220_1.

If the detection signal DET becomes the low level (L), the low level (L) may be input to the clear terminal CLR, and/or the first latch signal SSL_1 may become the low level (L).

Latches 520_2 to 520_n may be similar in operation to the first latch 520_1 described above, and a description thereof is thus omitted. However, the selection signal SS may be decoded differently by each latch, for example, the latches may decode the selection signal SS such that an clock terminal CK of each D flip-flop DFF becomes the high level in response to a different value of the selection signal.

According to the high voltage generating circuit and the semiconductor memory device having the same, the CBR pulse signal PULSE_CBR may be sequentially supplied to the pumpers 220_1 to 220_n, and/or a fluctuation in the high voltage Vpp may be reduced.

As described above, even though the selection signal SS output from the counter 510 may change, the transmitters 530_1 to 530_n that may be enabled in response to one selection signal SS may transmit the CBR pulse signal PULSE_CBR until the detection signal DET becomes the low level. Accordingly, in the above-described example embodiments, a case where each of the transmitters 530_1 to 530_n may include the SR latch circuit or the D flip-flop has been described. However, example embodiments are not limited thereto.

Therefore, the high voltage generating circuit and the semiconductor memory device having the same according to example embodiments may reduce a fluctuation in a high voltage. A method of generating a high voltage may reduce a fluctuation in the high voltage.

Although example embodiments have been shown and described in this specification and figures, it would be appreciated by those skilled in the art that changes may be made to the illustrated and/or described example embodiments without departing from their principles and spirit.

What is claimed is:

1. A high voltage generating circuit comprising:
   a pulse signal generator configured to be enabled in response to a refresh command signal to output a pulse signal;
   a counter configured to count the pulse signal and sequentially output a plurality of selection signals;
   a plurality of transmitters configured to be sequentially enabled in response to individual selection signals of the plurality of selection signals to transmit the pulse signal; and
   a plurality of pumpers corresponding to the plurality of transmitters, each of the plurality of pumpers configured to collectively generate a high voltage based on the transmitted pulse signal from a corresponding transmitter of the plurality of transmitters.

2. The high voltage generating circuit of claim 1, wherein the pumpers are configured to be sequentially enabled until the voltage level of the high voltage reaches a reference level.

3. The high voltage generating circuit of claim 1, further comprising:
   a detector configured to detect the voltage level of the high voltage, output a detection signal having a first level if the high voltage is smaller than a reference level, and output the detection signal having a second level if the high voltage is equal to or larger than the reference level.

4. The high voltage generating circuit of claim 3, wherein each of the transmitters is configured to transmit the pulse signal if the detection signal is at the first level.

5. The high voltage generating circuit of claim 4, wherein each of the transmitters comprises:
   a latch configured to output a latch signal in response to a corresponding individual selection signal, wherein the latch signal is output if the detection signal is at the first level; and
   an AND gate configured to be enabled in response to the latch signal to transmit the pulse signal.

6. The high voltage generating circuit of claim 5, wherein the latch comprises an SR latch circuit.

7. The high voltage generating circuit of claim 5, wherein the latch comprises a D flip-flop.

8. The high voltage generating circuit of claim 3, wherein the counter is configured to be reset in response to the detection signal having the second level.

9. A semiconductor memory device comprising:
   first to n-th memory banks configured to be selected in response to individual bank selection signals of a plurality of bank selection signals;
   first to n-th pulse generators corresponding to the first to n-th memory banks, configured to be enabled in response to a corresponding individual bank selection signal during a normal operation to output a normal pulse signal, and configured to be disabled during a refresh operation; and
   the high voltage generating circuit of claim 1, wherein
   the plurality of pumpers are first to n-th pumpers corresponding to the first to n-th memory banks, each of the first to n-th pumpers configured to collectively generate the high voltage based on the normal pulse signal supplied from a corresponding enabled pulse generator during the normal operation and collectively generate the high voltage based on the transmitted pulse signal from the corresponding transmitter of the plurality of transmitters during the refresh operation.

10. The semiconductor memory device of claim 9, wherein the first to n-th pumpers are configured to be sequentially enabled to generate the high voltage until the high voltage reaches a reference level.

11. The semiconductor memory device of claim 10, wherein the enabled first to n-th pumpers are configured to continuously generate the high voltage until the high voltage reaches the reference level, and if the high voltage reaches the reference level the first to n-th pumpers are disabled.

12. The semiconductor memory device of claim 10, further comprising:
    a detector configured to detect the voltage level of the high voltage, output a detection signal having a first level if the high voltage is smaller than the reference level, and output the detection signal having a second level if the high voltage is equal to or larger than the reference level.

13. The semiconductor memory device of claim 12, wherein each of the transmitters is configured to transmit the pulse signal if the detection signal is at the first level.

14. The semiconductor memory device of claim 13, wherein each of the transmitters comprises:
    a latch configured to output a latch signal in response to a corresponding individual selection signal, wherein the latch signal is output if the detection signal is at the first level; and
    an AND gate configured to be enabled in response to the latch signal to transmit the pulse signal.

15. The semiconductor memory device of claim 14, wherein the latch comprises an SR latch circuit.

16. The semiconductor memory device of claim 14, wherein the latch comprises a D flip-flop.

17. The semiconductor memory device of claim 12, wherein the counter is configured to be reset in response to the detection signal having the second level.

18. A method of generating a high voltage, the method comprising:
    generating a pulse signal in response to a refresh command signal;
    counting the pulse signal and sequentially generating a plurality of selection signals;
    sequentially transmitting the pulse signal as a plurality of sequentially transmitted pulse signals in response to individual selection signals of the plurality of selection signals; and
    generating the high voltage based on the sequentially transmitted pulse signals.

* * * * *